(12) United States Patent
Jibu

(10) Patent No.: US 6,349,063 B1
(45) Date of Patent: Feb. 19, 2002

(54) SEMICONDUCTOR MEMORY DEVICES AND DRIVING METHODS

(75) Inventor: Akira Jibu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,159

(22) Filed: Dec. 27, 1999

(30) Foreign Application Priority Data

Dec. 28, 1998 (JP) .............................. 10-374474

(51) Int. Cl.[7] ................................ G11C 7/00
(52) U.S. Cl. ................. 365/189.11; 365/226; 365/201
(58) Field of Search .................... 365/189.11, 201, 365/226, 189.09

(56) References Cited

U.S. PATENT DOCUMENTS

| 5,414,669 | A | * | 5/1995 | Tedrow et al. | 365/226 |
| 5,553,021 | A | * | 9/1996 | Kubono et al. | 365/226 |
| 5,694,365 | A | * | 12/1997 | Nakai | 365/226 |
| 5,781,473 | A | * | 7/1998 | Javanifard et al. | 365/226 |
| 6,154,411 | A | * | 11/2000 | Morishita | 365/226 |
| 6,154,412 | A | * | 11/2000 | Ishikawa et al. | 365/226 |

FOREIGN PATENT DOCUMENTS

| JP | 2-235368 | 9/1990 |
| JP | 6-28853 | 2/1994 |
| JP | 8-241592 | 9/1996 |
| JP | 10-337002 | 12/1998 |

OTHER PUBLICATIONS

Japanese Office Action, dated Mar. 21, 2001, with English language translation of Japanese Examiner's comments.

* cited by examiner

Primary Examiner—Tan T. Nguyen
(74) Attorney, Agent, or Firm—Whitham, Curtis & Christofferson P.C.

(57) ABSTRACT

In semiconductor memory devices containing a plurality of distributed pumping circuits in several capacity sizes for driving an in-chip voltage transforming power line, a coordinating operating mode signal controls the number and capacity rating of the pumping circuits to be put in or out of commission in energizing the memory devices in the normal memory switching operations and in the mode of preshipment burn-in tests.

18 Claims, 5 Drawing Sheets

SEMICONDUCTOR MEMORY DEVICES AND DRIVING METHODS

FIELD OF THE INVENTION

This invention relates to semiconductor memory devices, and more specifically to such memory devices having internal circuit means to generate raised power supply (hereinafter called internal supply line), and to the method of driving the memory devices.

BACKGROUND OF THE INVENTION

Semiconductor memory devices in the current state of the arts contain an intermediary of power supplies, capable of outputting discrete levels of voltage, up or down of a rated voltage of an internal supply line, to energize constituent elements, as required, instead of directly applying an external line rated at $V_{CC}$, so that the power dissipation and reliability of memory devices may be improved.

FIG. 1 shows a unit cell of DRAM (dynamic random access memory) including a switching transistor 11 and a memory capacitor 10. An n-channel MOS transistor is used in the DRAM cell, the drain D and the gate G being connected to a bit line 12 and a word line 13, respectively, and the source S to ground across the capacitor. If the internal supply line is charged at rated voltage, $V_{int}$, the transistor 11 will not switch on to conduct current between source S and drain D, unless the gate G is made more positive than the source S, by about equal to that of threshold voltage $V_T$ of the transistor 11.

At the onset of the address signals reception, a memory unit is selected and a transistor 11 is connected to bit line 12 and word line 13, accordingly. When a word line 13 is triggered with a high level signal, the transistor 11 switches on to cause a capacitor 10 to discharge and read memory current flows to the bit line 12, whereupon a sensing amplifier (not shown) initiates rewriting the capacitor with an electric charge equal to the storage memory data. With the industry arts progressing to larger integration, a smaller size will be demanded for memory capacitors, and will result in longer DRAM bit lines, with a consequence of a larger parasitic capacitance likely to load the bit line. On top of this, the internal supply line voltage ($V_{int}$) is now reduced to such a low power level that it compresses the output difference still further in read signals between memory data "0" and "1".

Supposing a conducting transistor 11 is energized by an internal supply line voltage, $V_{int}$, directly from the bit line 12 and word line 13, the source S will be at a potential level of $V_{int}-V_T$. When read current flows from a capacitor 10, a sensing amplifier reads the level of bit line 12 at $V_{int}-2V_T$ volts, with a voltage drop across transistor 11 taken into account.

The occurrence of inaccurate reading probabilities could be prevented when the word line 13 voltage is boosted. The reduction of a bit line voltage causes memory reading accuracy likely to be impaired by transistor threshold value, $V_T$; when the bit line 12 and word line 13 are charged with $V_{int}$ and $V_{int}+V_T$, respectively, the transistor source S is at $V_{int}$, higher than before, to render further reading accuracy deterioration to be prevented. Here a symbol, $V_{BOOT}$, should be introduced in order to refer to transistor gate voltage. The internal supply lines have means to generate raised supply voltage $V_{BOOT}$, as needed, to a gate of the switching transistor; for an example, a DRAM for $V_{CC}$ equal to 3.3 volts, $V_{BOOT}$ will be equal to 5.1 volts.

Technically, DRAM output includes p-channel and n-channel MOS transistors interconnected, an example is shown in FIG. 2. P-channel MOS transistors read a power supply $V_{CC}$ at terminal DATA OUT, without being affected by voltage drops across a conducting transistor albeit at slow recovery time from 0 to $V_{int}$ volts, due to an inherently small driving current. N-channel MOS transistors have a faster switching rate, except for the gate voltage that needs to be raised to make up for the voltage drop at the output, as observed previously. An inverter circuit in FIG. 2 achieves high speed switching by having two n-channel MOS transistors, 14 and 16, connected to an output terminal, DATA OUT, with a transistor 14 gate energized at $V_{BOOTQ}$. Transistors 14 and 16 receive two complementary signals, OUT and $\overline{OUT}$ at the gates, as shown. Example: $V_{CC}$ equal to 3.3 volts, $V_{BOOTQ}$ as required is 4.5 volts, which demonstrates another case of an internal supply line serving to generate a raised power level to a bit line in addition to a word line, as previously dealt with, in the switching transistor devices.

After production prior to shipment, DRAM devices go to a burn-in testing station. Burn-in tests are performed under voltage stress in order to reduce the initial failure rate of the DRAM devices. For DRAM devices of rated external power supply at 3.3 volts ($V_{CC}$), a stress level of 5.2 volts in the external power supply is required to run burn-in tests, whereby the internal power supply rises to 7.5 volts, causing in turn $V_{BOOT}$ voltage to rise from a calculated level of about 7 volts in normal switching condition to 10 volts or more momentarily at the source and the drain of the transistor during burn-in tests. This is counteractive indeed to DRAM devices of the current rapidly growing trend of micro-miniaturization, when the supply voltage of the integrated circuits is already low enough to render the burn-in tests liable to damage the products prior to shipment.

Internal power lines, which are semiconductor arrays in a DRAM chip, consist of means of charge pumping, sensors and clock signal generators to feed switching transistors with raised levels of voltage. If the internal supply line has a point of connection to word lines and transistor outputs (or the drains) clustered around at the end of the feeder line, transistors farther away from the feeder connection are liable to cause the energizing voltage to fall short of the requisite levels. These shortcomings will become more critical with the current trend to longer DRAM bits. They will have larger internal supply lines and larger current conducting resistance causing an adversary impact upon the performance of DRAM devices in respect of readout errors and output rise time.

SUMMARY OF THE INVENTION

An object of the invention is to offer improved semiconductor memory devices that will not cause breakdown during burn-in tests in the transistors and other constituent elements at accelerating stress voltage levels on internal supply lines.

Another object of the invention is to offer improved semiconductor devices, capable of making requisite levels of voltage available, regardless of the point of connection along the internal power supply line, to the word lines and the output circuits.

A further object of the invention is to offer the driving method of such improved semiconductor devices.

One preferred embodiment of the invention refers to configuration of a semiconductor memory device including an internal supply line energized by a plurality of dispersed pumping circuits in different levels of pumping capacity, whereby they may be selectively deactivated by the burn-in mode signal to initialize performing the burn-in test.

Another preferred embodiment of the invention refers to the method of driving a semiconductor memory device including an internal supply line being energized by a plurality of dispersed pumping circuits having different levels of pumping capacity, whereby the driving method is contrived to selectively deactivate the pumping circuits by causing the burn-in mode signals to trigger the deactivation accordingly, in performing burn-in tests.

A plurality of the pumping circuits are arranged dispersively along the internal supply line so that they may be connected at least at the both ends and in the middle of the internal supply line, in the two preferred embodiments. In either embodiment, it is necessary to prioritize the deactivation of pumping circuits by size of the capacity.

DESCRIPTION OF THE PREFERRED EMBODIMENTS

Figure 3:
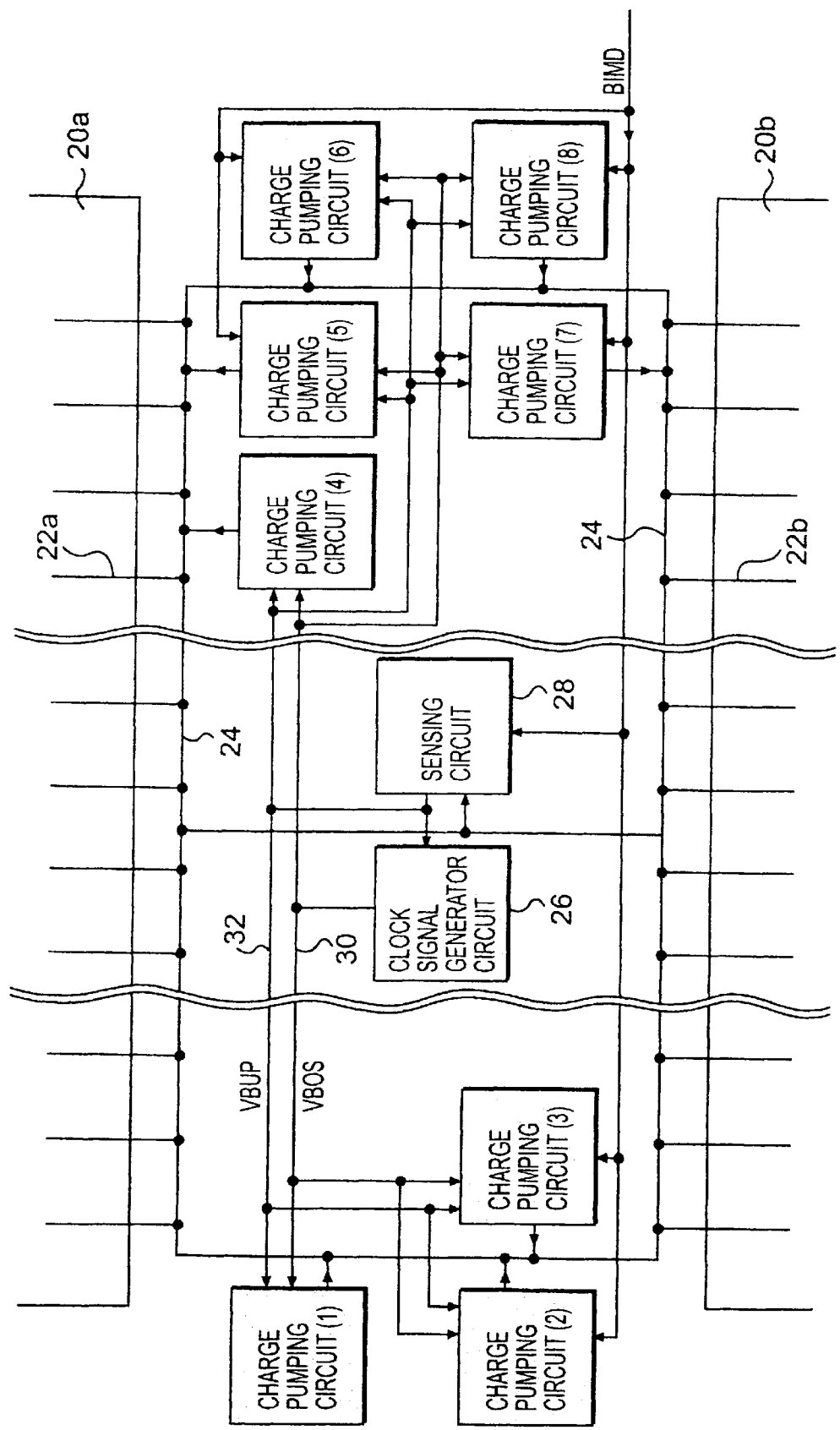
FIG. 3 is a distributed layout of an internal supply line configuration for word lines that comprises of a multiplicity of charge pumping circuits (hereinafter called pumping circuits), a sensing circuit and a clock signal generator circuit (hereinafter called clock signal circuit).

FIG. 3 shows: an arrangement of two banks of cell arrays, up and down for 20a and 20b, with the corresponding banks of word lines 22a and 22b energized by the internal supply line 24 in a closed conductor loop.

The line 24 receives power from eight distributed pumping circuits 1 through 8. As shown, the pump circuits 1 through 3 are arranged to the left of line 24, while the pumping circuits, 4 through 8, are to the right. All of the eight pumping circuits are not meant to be of the same pumping capacity; they have different capacity size. For example, pumping circuits 1 and 4 are of less capacity than each of the others, 2, 3, 5, 6, 7 and 8. The pumping capacity shall refer to the voltage level that a pump circuit is able to boost at the onset of the clock signal reception.

The clock signal circuit 26 and the sensing circuit 28 are arranged near the center of the line 24. The sensing circuit 28 should preferably be located farthest from the pumping circuits so as to detect a pumped voltage at its lowest level.

The clock signal circuit 26 provides clock signal VBOS to all the pumping circuits, 1 through 8, over the clock signal line 30.

The sensing circuit 28 detects the line voltage 24, compares it with a reference voltage, and produces a signal VBUP, which is supplied to the clock signal circuit 26 and to all of the charge pumping circuits, 1 through 8, over VBUP signal line 32.

Each of the larger pumping capacity circuits, 2, 3, 5, 6, 7, and 8, receives the BIMD signal in the burn-in test mode. A voltage detector circuit (not shown) generates BIMD when it detects a measure of burn-in test voltage on the external supply line, which can be a difference between a reference voltage and either the external supply voltage itself or a resistance potentiometer output that divides the external supply line voltage. A ruled combination of High and Low signals to pilot the levels of the power supply line can be utilized as the BIMD signal in another operating system.

When the internal supply line 24 is less than the rated value for a normal memory switching operation, the BIMD signal is at LOW level so as to cause the sensing circuit 28 to produce a High level VBUP signal (here one can say VBUP is activated) and to trigger the VBOS clock signal. At the onset of reception of the VBOS signal, the pumping circuits, 1 through 8, will in turn raise the internal supply line 24 to $V_{BOOT}$ volts at the level that correlates with the external supply line voltage $V_{CC}$ in the normal memory switching mode. The controlled voltage $V_{BOOT}$ will then energize the word lines, 22a and 22b. Conversely, should the internal supply line voltage become elevated beyond a rated value of normal operation, the sensing circuit 28 will deactivate to produce Low level VBUP, causing the clock signal VBOS to be disconnected from the pumping circuits, 1 through 8; by repeating the above process step-by-step, $V_{BOOT}$ can be regulated downwards to a set level in energizing word lines 22a and 22b.

In the burn-in test mode, however, the external supply voltage is switched to 5.2 volts, and the High BIMD signal is applied to deactivate the pumping circuits, 2, 3, 5, 6, 7, and 8. Since the pumping circuits 1 and 4 do not receive the BIMD signal, they will continue producing a higher output energy level on their own until they stop raising and maintain the level on the internal power circuit as if they were connected to the external supply line at 5.2 volts. The level will not be the case of the isolated regulating process above; however, the High level BIMD signal affects the reference voltage level in the sensing circuit to render the level a little higher than the isolated case just referred to.

Figure 4:
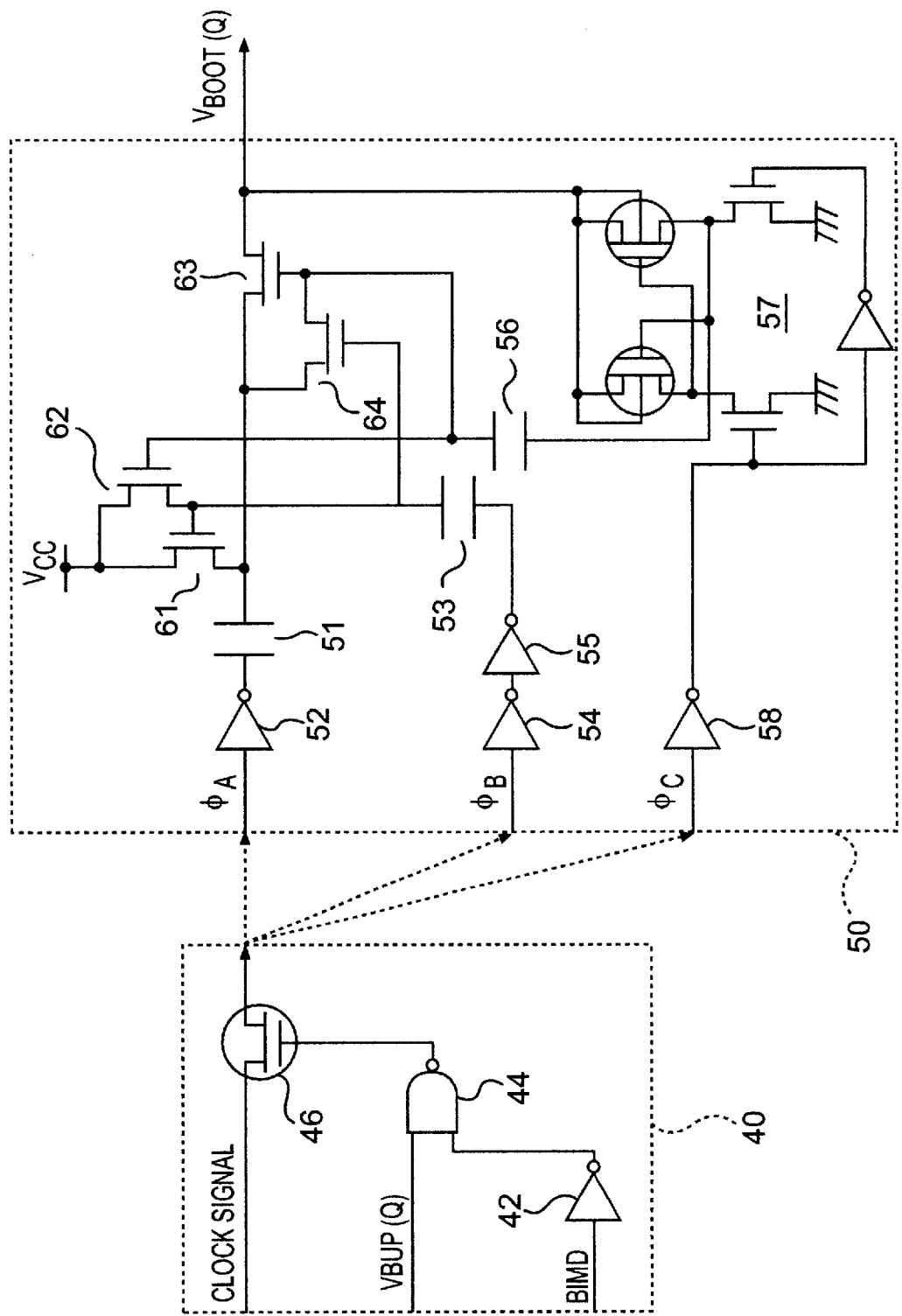
FIG. 4 is an example of a pumping circuit with a large pumping capacity.
Figure 5:
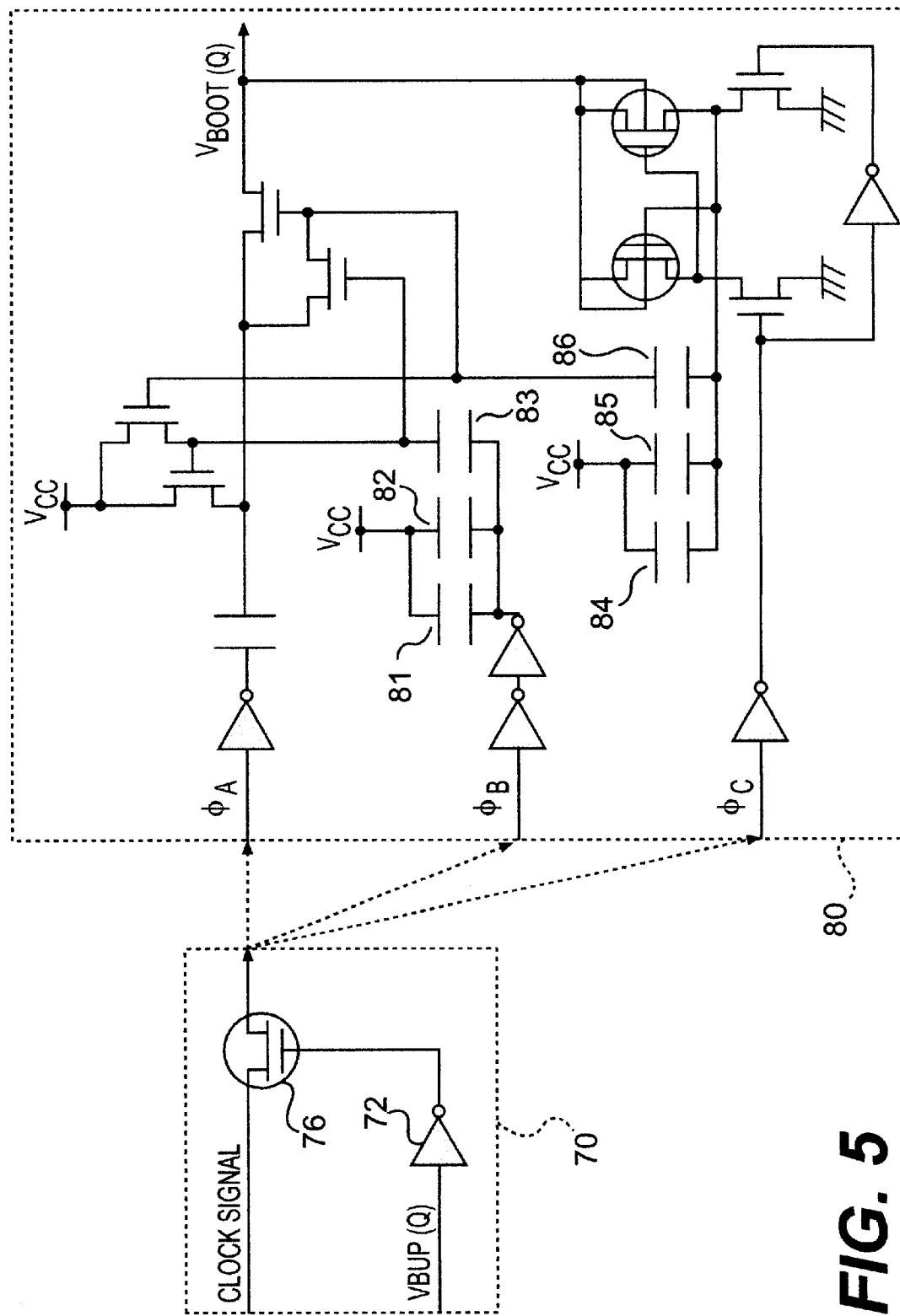
FIG. 5 is an example of a pumping circuit with a small pumping capacity.

FIG. 4 shows an example of any one of the pumping circuits, 2, 3, 5, 6, 7 and 8, all of large pumping capacities. FIG. 5 shows an example of either one of the pumping circuits 1 and 4 of lesser capacities.

The pumping circuit in FIG. 4 consists of a pump 50 to output raised voltage $V_{BOOT}$, and a switcher 40 to control clock signal supply. The switcher 40 is comprised of an inverter 42, a NAND gate 44 and a p-channel MOS transistor 46. Inverter 42 outputs inverted BIMD signal to a NAND gate, while VBUP signal is connected to the other gate. Finally, the NAND gate (44) output is conducted to the transistor (46) gate.

Supposing BIMD input signal is Low to coordinate with low output $V_{BOOT}$ from the pump 50 and the other input $V_{BUP}$ is a High signal, NAND output will be Low to switch the transistor 46 on. A pass-through clock signal is supplied to the pump 50, being divided into $\phi_A$, $\phi_B$ and $\phi_C$, and restores a rated level, step-by-step to $V_{BOOT}$. Conversely, when $V_{BOOT}$ is a high output level, $V_{BUP}$ drops low enough to cut off the transistor pass-through current, and the clock signals $\phi_A$, $\phi_B$ and $\phi_C$ are no longer supplied to the pump 50, allowing $V_{BOOT}$ to follow through a series of self-correction loops to reach and remain at a rated level, and the normal operation is sustained.

Operation of the circuit (FIG. 4) will be explained during the burn-in test. External supply line is high (eg $V_{CC}$=5.2 volts as against 3.3 volts during volts during normal memory switching operation) and the BIMD signal is at High. The NAND (44) logic output is High, regardless of the other input (VBUP), causing to switch the transistor 46 off and stalling the boosting process of the pump 50.

The pump 50 includes, among other elements, a pumping capacitor 51, an inventor 52, a boot-up capacitor 53, an inverter 54, a transistor 63, a boot-up capacitor 56, an inverter 58, a voltage transforming level shifter 57, MOS transistors 61, 62 and 64. They are interconnected as shown in FIG. 4.

The clock signals $\phi_A$, $\phi_B$ and $\phi_C$, as supplied to the inverters 52, 54 and 58, respectively, are produced from phase modifiers (not shown), with the same amplitude as with an external supply $V_{CC}$. The clock signal $\phi_A$ has a duty ratio of 50%. The clock signal $\phi_B$ is in phase with $\phi_A$, except that it has a shorter High level duration as compared to $\phi_A$. The clock signal $\phi_C$ is in phase with $\phi_A$, but has a shorter Low level duration as compared with $\phi_A$. The purpose of staggering the level duration, just explained, is to prevent current from circulating around a loop among the switching transistors. The role of the pump 50 is to store energy to the pumping capacitor 51 to a calculated voltage level, ($V_{CC}-V_T$)+$V_{BOOT}$, which is higher than the external supply line voltage $V_{CC}$, and is supplied to the internal supply line 24, and maintained at this calculated level.

Suppose the clock signal $\phi_A$ is High; the inverter 52 output is Low, the transistor 61 is on to cause the pumping capacitor 51 to be charged up from $V_{CC}$. The capacitor 51 maintains a high voltage on the right plate, while the left plate, purged of the charge, returns to 0 volt. When the clock signal $\phi_A$ drops to Low, the inverter (52) output turns to High. The right hand plate of the pumping capacitor 51 will then be energized by an incremental voltage equal to the inverter (52) output, so that it will rise to a level of $2V_{CC}$ at its crest value. After passing through smoothing circuit, the voltage $V_{BOOT}$ so raised will be applied through the conducting transistor 63 to the internal supply line 24, and applied to the word line 22, as explained earlier in the circuit operation, FIG. 3.

In order to charge the right hand plate of the pumping capacitor 51, it is to be recalled, the transistor gate (61) must be energized with a voltage level at least equal to $V_{CC}+V_T$ to switch it on. The transistor 62 and the boot-up capacitor 53 will make this voltage available at the transistor gate (61); when the clock signal $\phi_C$ is Low, the transistor (62) gate is High to switch the transistor 62 on, which, when, in the same clock cycle, as $\phi_B$ turns to Low, inverter (55) output turns to Low, so that upper plate of the boot-up capacitor 53 is energized with $V_{CC}$, while the lower plate is purged to 0 volts.

By the same token, the transistor 63 needs at least $V_{BOOT}+V_T$ at the gate to energize the raised supply line to $V_{BOOT}$. The transistor 64 and the boot-up capacitor 56 will serve to switch the transistor (63) on/off. That is, when the clock signal $\phi_B$ is High, the transistor (64) gate is High to switch it on. At the same time, when the clock signal $\phi_C$ is High, the level shifter (57) output is Low, causing the upper plate of the boot-up capacitor 56 to be charged at $V_{BOOT}$, and the lower plate purged to 0 volt.

Supposing the clock signals $\phi_B$ and $\phi_C$ are Low, the level shifter 57 will produce High signal, which will produce an incremental voltage on top of the upper plate of the boot-up capacitor 56 that has been previously energized, to a crest voltage of equal to $2V_{BOOT}$. The incremental voltage causes transistor 63 to switch on, and the boosted upper plate voltage will be supplied to the internal supply line 24.

The charge pumping circuits of lesser capacity, shown in FIG. 5, comprises a switcher 70 and a pump 80. The switcher 70 includes an inverter 72 and a p-channel MOS transistor 76 arranged to operate on a logic switching sequence: High VBUP signal to switch the transistor 76 on to pass the clock signal into the pump 80.

The pump 80 is basically in the same configuration as the pump 50 in FIG. 4, except that the two boot-up capacitors have been split up into two clocks of three distributed capacitors 81, 82 and 83 in parallel for one, and three distributed capacitors 84, 85 and 86 for the other, which measure up to absorbing spike energy at the time of burn-in tests. The splitting was a necessary rout to moderate the pumping capacity, indeed.

During the normal memory switching operation, the pumps 1 and 4 are dispersed to receive energy along the span of the internal supply line 24. There is nothing new in producing energy supply from the pumps 1 and 4 to the internal supply line 24, and there is no reason to worry about expecting reading errors.

Burn-in testing operation is now addressed. The memory chip in FIG. 3 receives the High BIMD signal, which shuts down the large capacity pumping circuits 2, 3, 5, 6, 7 and 8, leaving in only the pumping circuits 1 and 4 remaining to supply a raised voltage level. The advantage of two pumps, not eight, is reduction of the operating current and accordingly less heat generation from the devices.

It is a known arts in the current semiconductor memory devices to construct a plurality of pumping circuits lumped in a confined section of the chip and to select less number of active pumping circuits as the energizing voltage on the external power line or the internal supply lines. Even considering the above layout to apply to a chip of large surface area with a means to sectionalize voltage application, internal supply lines are susceptible to voltage drop, making it impossible to maintain substantially a uniform potential distribution over the word lines, so that reading error possibilities will be increased. The dispersed layout of pumping circuits (see FIG. 3), renders the internal supply line less in voltage drop, and word lines are energized substantially at the same voltage level.

When, during burn-in tests, pumping circuits are cut off, protection against voltage surge kick from the internal supply line would need to be accounted for. Suffice to say that the stress voltage protection can be solved by providing a suitable means of over-voltage safety device before performing the burn-in test. This leads to yield a new advantage to being able to design pumping circuits at a higher capacity level.

Figure 1:
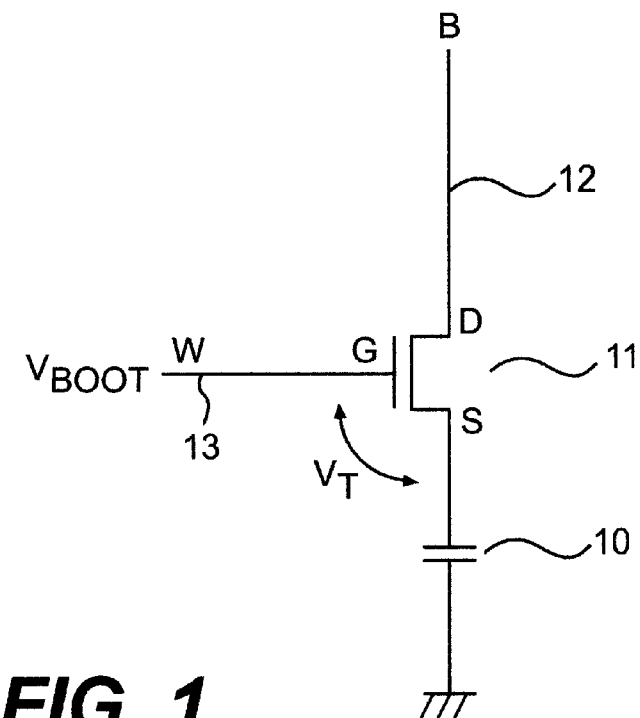
FIG. 1 is a circuit diagram of a part of the memory cell.
Figure 2:
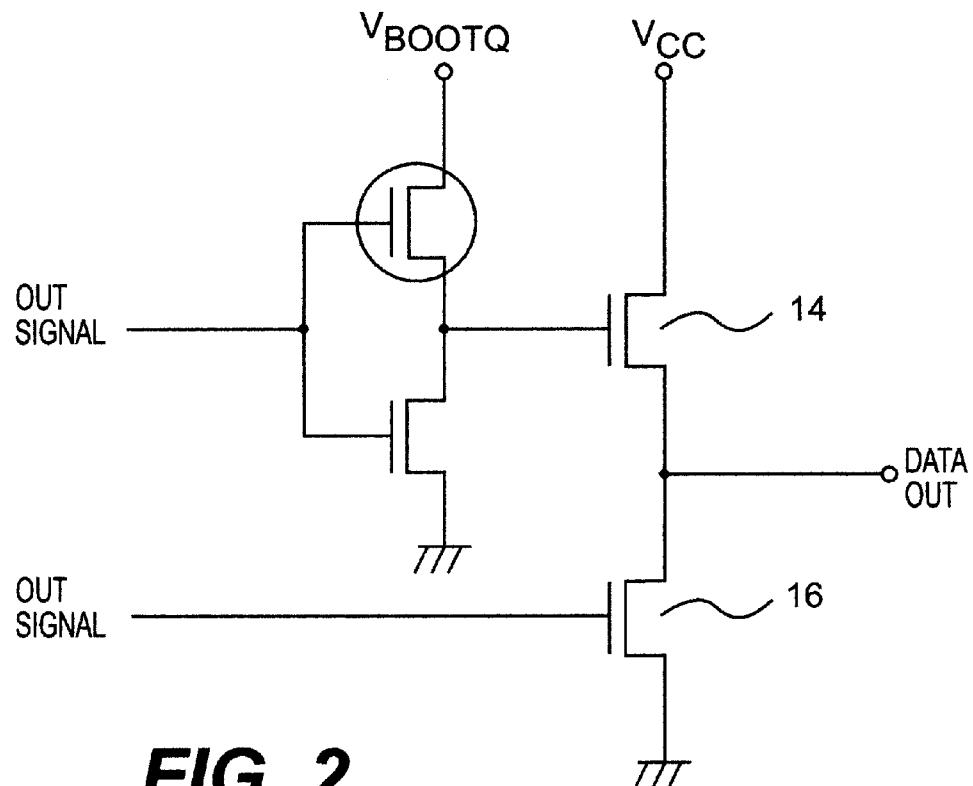
FIG. 2 is a circuit diagram of a part of the output circuit.
Figure 6:
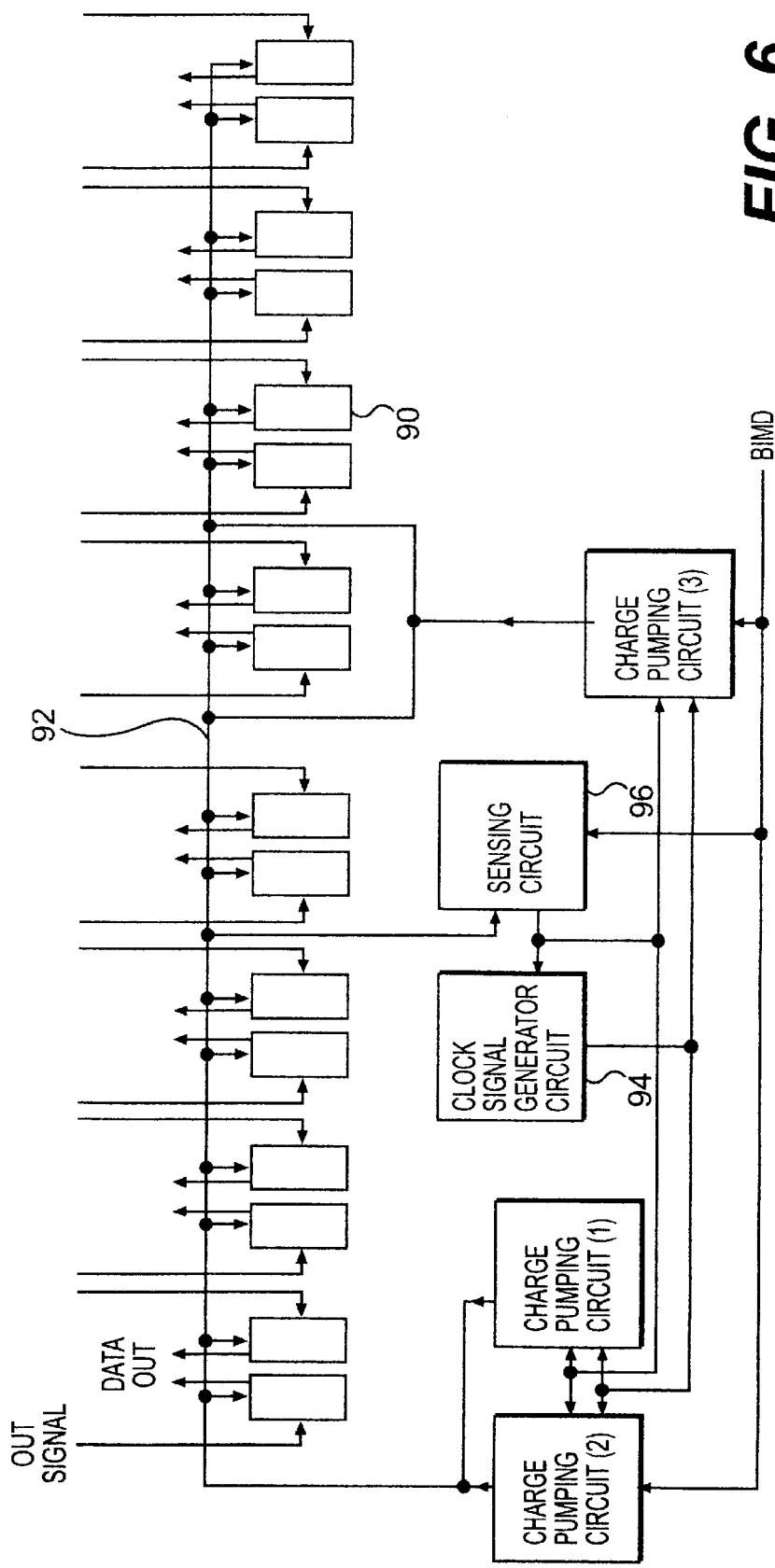
FIG. 6 is a distributed layout of an internal supply line configuration for the output circuits, which comprises a multiplicity of pumping circuits, a sensing circuit and a clock signal circuit.

FIG. 6 is a circuit layout, which include pumping circuits, a sensing circuit, a clock signal circuit, all in distributed layout in a chip. As explained in FIG. 2, each output circuit 90 has an input to receive Out signal, and the output to produce DATAOUT. All output circuits 90 are energized from a linear conductor of the internal supply line 92 at $V_{BOOTQ}$. The internal supply line 92 has three pumping circuits 1, 2 and 3 connected to the line 92 dispersively, as shown; the pumping circuit 3 is located in the mid section, while the pumping circuits 1 and 2 are arranged to the left as shown in the drawing. The pumping circuits 2 and 3 have large pumping capacity, each, and the pumping circuit 1, less. BIMD signals are wired to the pumping circuits 2 and 3 only, as shown. The layout and operating principle of the large pumping circuits 2 and 3 are the same as those explained in FIG. 4; the same goes with the lesser pumping circuit 1 as explained in FIG. 5. The clock signal circuit 94 and the sense circuit 96 are distributed in the mid section of the line 92.

With the dispersed pumping circuits and the output circuits 90 spread out along the linear line 92, there is substantially no cause to reason that the chance of output circuit malfunctioning would mount.

Referring to FIG. 6, the pumping circuits 2 and 3 will cease to function at the onset of the BIMD signal reception, leaving in only the pumping circuit 1. The external power line is energized at a voltage $V_{int}$ during burn-in test, which is higher than during the normal switching operation, and one pumping circuit is sufficient to energize the entire network of output circuits. There would be no adverse effect of pumping circuit, being connected at the end of the linear line 92, inasmuch as the line drains so much less current. The burn-in test has an advantage of yielding low heat dissipation due to two pumping circuits, being retired out of three.

What is claimed is:

1. A semiconductor memory device having an internal supply line, comprising:

a plurality of pumping circuits, wherein said pumping circuits in several pumping capacity sizes are distributed, and wherein at least one of the pumping circuits is made inactive by a burn-in test mode signal during a burn-in test of the semiconductor memory device.

2. A semiconductor memory device according to claim 1, the pumping circuits which are made inactive by the burn-in test mode signal are chosen from the pumping circuits having large pumping capacity.

3. A semiconductor memory device according to claim 2, said pumping circuits are distributed at least near the both ends and in the middle of the supply line.

4. A semiconductor memory device according to claim 1, wherein said pumping circuits are distributed at least near both ends and in the middle of the internal supply line.

5. A semiconductor memory device according to claim 1, said pumping circuits are distributed at least near the both ends and in the middle of the internal supply line.

6. A semiconductor memory device according to claim 1, said burn-in mode signal is generated by comparing an externally fed voltage or a voltage which is divided in a resistor ratio from the externally fed voltage with a reference voltage.

7. A semiconductor memory device according to claim 1, wherein a burn-in mode signal is generated by setting a combination of high and low levels of an externally input signal.

8. A semiconductor memory device according to claim 1:

wherein said plurality of pumping circuits are provided for use of word line of memory cells.

9. A semiconductor memory device having an internal supply line, comprising:

a plurality of pumping circuits, wherein said pumping circuits in several pumping capacity sizes are distributed, and wherein the differentiation by the pumping capacity is performed by dividing boot-up capacitors in respective pumping circuits.

10. A semiconductor memory devices according to claim 8, said plurality of pumping circuits further includes a plurality of pumping circuits for use of data outputting circuits.

11. A method of driving a semiconductor memory device having a built-in booster circuit which comprises a plurality of pumping circuits, wherein said pumping circuits are composed to have different pumping capacity respectively, being distributed separately within the semiconductor memory device and at least one of said pumping circuit is made inactive by a burn-in test mode signal at a burn-in test of the semiconductor memory device.

12. A method of driving a semiconductor memory device according to claim 11, said pumping circuit which is made inactive by the burn-in test mode signal is chosen from the charge pump circuits having a greater pumping ability.

13. A method of driving a semiconductor memory device according to claim 11, said pumping circuits are distributed near the both ends and in the mid section of the internal supply line.

14. A method of driving a semiconductor memory device according to claim 11, said differentiation of pumping capacity of each of pumping circuits is performed by dividing boot-up capacitors in the pumping circuits.

15. A method of driving a semiconductor memory device according to claim 11, said burn-in mode signal is generated by comparing an externally fed voltage or a voltage which is divided by dividing by resister ratio from the externally fed voltage with a reference voltage.

16. A method of driving a semiconductor memory device according to claim 15, said burn-in mode signal is further generated by setting a combination of high and low level of an externally input signal.

17. A method of driving a semiconductor memory device according to claim 11, said plurality of pumping circuits are provided for use of word line of memory cells.

18. A method of driving a semiconductor memory device according to claim 17, said plurality of charge pump circuits further include a plurality of charge pump circuits for use of data outputting circuits.

* * * * *